June 19, 1962 W. L. OATES 3,039,185

SOLDERING APPARATUS AND METHOD

Filed July 23, 1957 3 Sheets-Sheet 1

INVENTOR.
William L. Oates
BY
Morris Rabkin
ATTORNEY.

SOLDERING APPARATUS AND METHOD

Filed July 23, 1957 3 Sheets-Sheet 2

INVENTOR.
William L. Oates
BY Morris L. Rabkin
ATTORNEY.

June 19, 1962 W. L. OATES 3,039,185

SOLDERING APPARATUS AND METHOD

Filed July 23, 1957 3 Sheets-Sheet 3

INVENTOR.
*William L. Oates*
BY *Morris [signature]*
ATTORNEY.

3,039,185

SOLDERING APPARATUS AND METHOD

William L. Oates, Mount Holly, N.J., assignor to Radio Corporation of America, a corporation of Delaware Filed July 23, 1957, Ser. No. 673,690
8 Claims. (Cl. 29—503)

This invention relates to a soldering apparatus and method, and more particularly to an improved apparatus and method for applying solder to a sheet of insulating material having a plurality of electrical conductors disposed on a surface of the sheet.

The apparatus and method are particularly adaptable to the soldering of printed or plated circuits. A common type of printed circuit comprises a sheet of electrically insulating material, such as a phenolic board, carrying on one surface a plurality of electrical conductors in the form of thin, flat strips integrally united to the insulating material. The conductors are referred to as printed wiring. The printed circuit is completed by mounting on the other surface of the insulating sheet, which may be referred to as a wiring board, a number of components and connecting them, by means of leads extending through holes in the wiring board, to the printed wiring. There is a considerable problem in making these connections rapidly, efficiently, and effectively.

In the highly competitive field concerned with the manufacture of printed circuits for use in all types of electrical and electronic equipment, it is desirable to provide automatic apparatus which is capable of soldering all of the connections of a printed circuit substantially simultaneously. One technique for soldering all such connections simultaneously is that of dip-soldering. With this technique, the entire side of the printed circuit containing the printed wiring, with the leads from the circuit components projecting from various points on the surface, is engaged with the surface of a bath of molten solder and removed after a certain time.

The dip soldering technique has certain undesirable limitations and disadvantages. Some of these are discussed immediately following. (1) The surface of the solder bath, which is contacted by the printed circuit, is exposed to the atmosphere. Because the solder is maintained at a temperature of several hundred degrees Farenheit, oxide readily forms and floats on the surface. Other impurities also form as a result of the dipping operations and float with the oxide on the surface. All of these impurities, which will be referred to as dross, may cause poorly soldered circuits. (2) The above discussed dross must be removed periodically. (3) Since the printed circuits must be partially immersed in the solder bath for a certain time, a substantial amount of heat is absorbed by the board which may result in the blistering of the board and damage to the circuit components mounted on the board. Because of this, either the temperature of the solder bath may have to be compromised in order to protect both the components and the circuit board or special components and board materials may be required in order to withstand the necessary heat of the solder bath. (4) If the printed circuits are carried into and out of the bath by means of a mechanized conveyor, the level of the solder bath must be very accurately maintained. If not, solder will either be forced through the terminal holes in the board or miss the printed wiring surface completely. (5) Pallets or fixtures, which may be used to carry the printed circuits, must be designed to withstand the heat and dross of the solder bath. (6) The printed circuits must be maintained perfectly flat when they are engaged with the solder bath in order that the entire surface will be soldered. (7) Flux or flux gases may be trapped during soldering, causing poor soldering of the printed circuit. (8) The speed of removal of the printed circuit from the solder is very critical and must be relatively slow in order to prevent excessive amounts of solder from adhering to the metal circuits in the form of blobs and tears with a tendency to bridge or short the wiring.

An object of the present invention is to provide an improved soldering apparatus and method which obviate the above discussed limitations and disadvantages of the dip-soldering technique.

Another object of this invention is to provide an improved apparatus, for soldering the entire surface of a sheet, which is very simple in structure and which is very readily maintained.

A further object of this invention is to provide an improved apparatus, for soldering the entire surface of a sheet, which is flexible in operation and which is adapted for soldering fast moving, conveyorized sheets.

Apparatus for accomplishing these and other objects includes a pot or tank for molten solder. A block of heat conductive material is mounted over the tank. The block is disposed so that its lower portion is submerged in the solder bath. An inclined trough is formed in the upper face of the block. A labyrinth path is provided adjacent to one face of the block and terminates in an orifice slot at the upper end of the trough. A plurality of ridges lie across the trough. A pump forces solder, from a point beneath the solder level, upwardly through the labyrinth so that it flows down the trough with a minimum of turbulence. The ridges form a plurality of crests which are engaged by the surface of a sheet passing over the trough.

The novel features of the invention, as well as additional objects and advantages thereof, will be understood more fully from the following description when read in connection with the accompanying drawings, in which.

Figure 3:
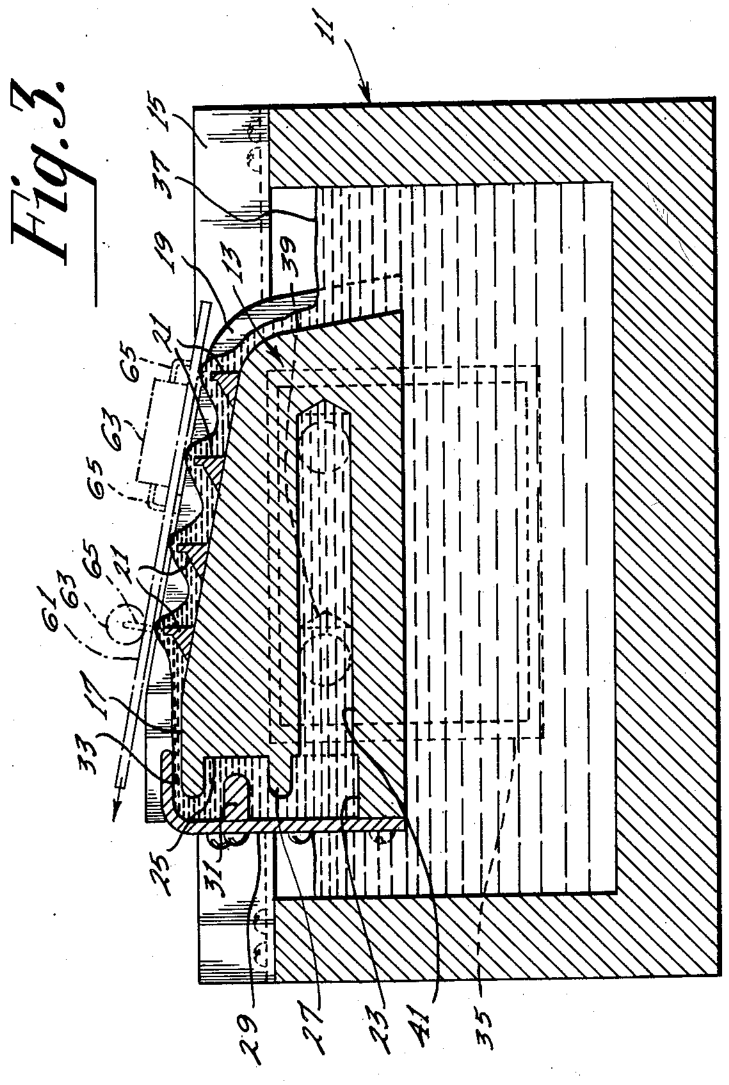
FIGURE 3 is a view taken along the line 3—3 of FIGURE 1, showing the flow of solder in the apparatus and showing, in phantom, the position of a printed circuit which is being soldered.

Referring now in detail to the accompanying drawings, a preferred embodiment of the invention will be described. The apparatus described is particularly applicable for the soldering of printed circuit boards which are carried on a continuously moving conveyor having suitable fixtures or pallets for supporting the boards. The boards are carried in a linear path adjacent the apparatus, as indicated in FIGURE 3.

The entire apparatus is mounted in a tank or pot 11, having powerful heating elements thermostatically controlled, such as might be used in a dip soldering operation.

A block 13, which is generally rectangular in configuration, is supported by a pair of brackets 15 secured to the top of the tank 11. The block 13 is preferably made of steel, although any suitable heat conductive material may be used. The material should be highly heat conductive in order to maintain the solder temperature as constant as possible. A continuous trough 17 is formed in the upper face and one end face of the block. The trough is inclined at an angle of 10 degrees, with respect to the horizontal, along the upper face of the block and merges into a sharply sloping portion along the end face of the block. The trough is defined by side rails 19.

Four ribs 21, mounted on the bottom of the trough at the upper portion thereof, define ridges which extend across the trough between the side rails 19. The ribs 21 are of uniform cross sectional configuration and are disposed in spaced relation to each other along the trough to provide valleys or trenches therebetween. The tops of the ribs lie in a common plane which is slightly below the top of the side rails 19.

At the end of the block 13, adjacent to the upper end of the trough 17, horizontal chambers 23 and 25 are formed, the chambers being partially separated by a horizontal rib 27. A face plate 29 is mounted over the end face of the block 13 to enclose the chambers 23 and 25. A horizontal rib 31, mounted on the face plate 29, extends partially into the chamber 25. The upper portion of the face plate 29 is bent inwardly between the side rails 19 and over the bottom of the trough 17 to define a horizontal orifice slot 33 at the upper end of the trough. The ribs 27 and 31 and the chamber 25 then define a labyrinth path for the flow of solder from the chamber 23 upwardly to the orifice slot 33. This labyrinth path is provided to equalize the solder pressure over the length of the slot 33 as it emerges from the slot and begins its flow downwardly along the trough.

Figure 1:
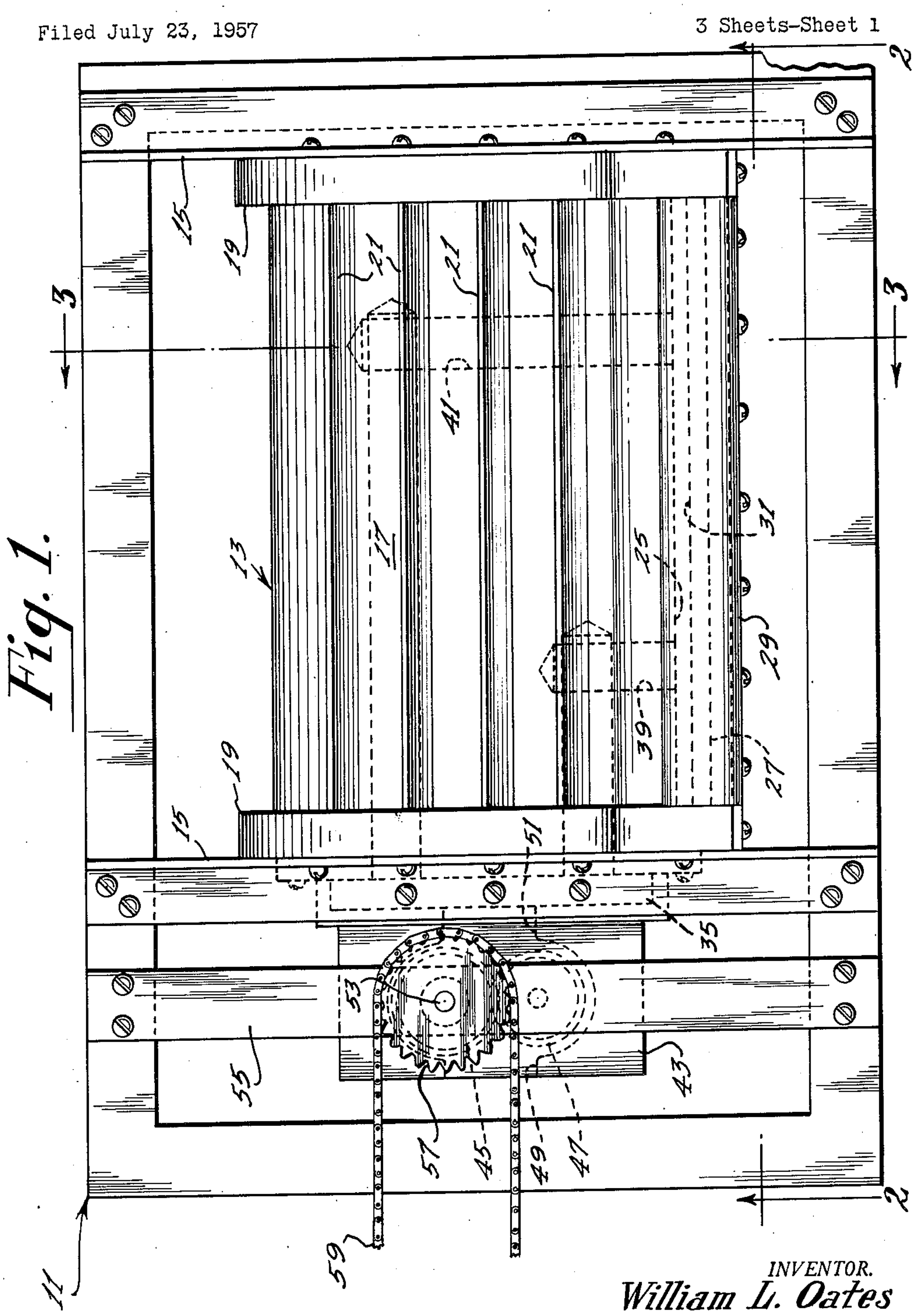
FIGURE 1 is a plan view of apparatus according to the present invention.
Figure 2:
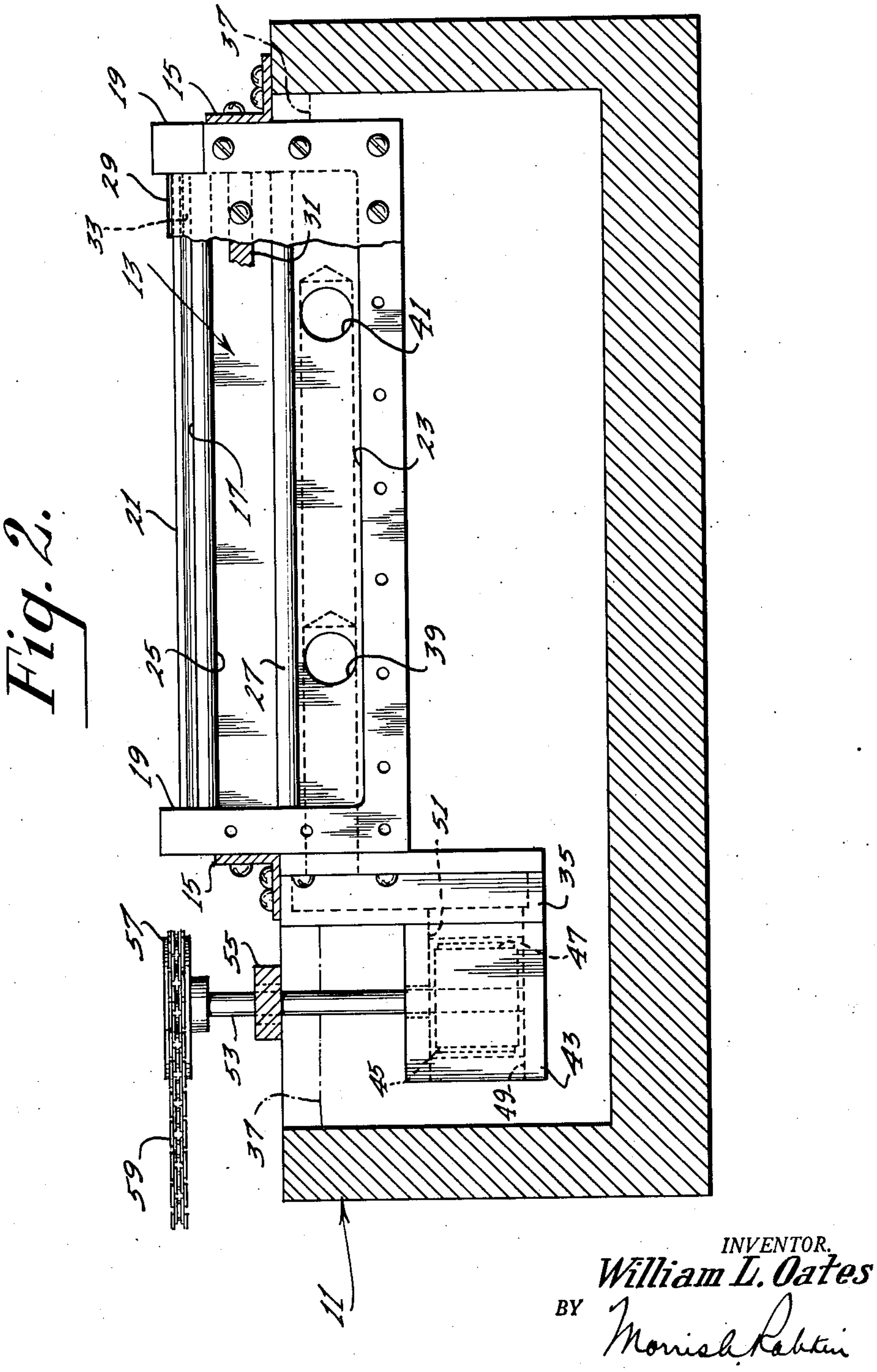
FIGURE 2 is a view taken along the line 2—2 of FIGURE 1, a plate for one face of the block being partially broken away for clarity of illustration.

A manifold 35 is mounted on one side of the block 13 and extends downwardly from the block so that its lower portion is substantially beneath the level of the solder 37 in the tank 11. The disposition and flow of the solder 37 is shown in FIGURE 3. The solder level, only, is indicated in FIGURE 2. Two right angled horizontal passageways 39 and 41 are drilled in the block 13 to provide two separate paths for the flow of solder from the manifold 35 to the chamber 23. Two suitable apertures are provided in the manifold to mate with the passageways 39 and 41 in the block. A gear pump 43 is secured to the face of the manifold opposite to that secured to the block 13. The gear pump is conventional and comprises mating gears 45 and 47, an intake opening 49 and an output opening 51. The output opening 51 mates with a suitable opening in the manifold 35.

The gear 45 of the gear pump is secured to a shaft 53 which extends upwardly out of the tank 11. The upper end of the shaft 53 is supported by a suitable bearing mounted on a bracket 55 secured across the tank 11. A sprocket wheel 57 is secured to the upper end of the shaft 53 and is provided for the purpose of driving the gear pump from a drive source, such as an electric motor, by means of a chain 59, for example. An adjustable speed control for the motor is desirable.

In operation, the tank 11 is filled with solder to a level near the top of the tank as indicated in FIGURES 2 and 3. It will be apparent, from the following, that the level at which the solder need be maintained is not critical. The solder pump intake is positioned sufficiently below the solder level, so that considerable variation in solder level might occur without affecting the operation of the apparatus. Also, the intake solder is always clean. The solder level should be maintained high enough so that the heat from the solder bath is transmitted through the block 13.

The solder is pumped into the manifold and is dispersed through the passageways 39 and 41 into the chamber 23. Two passageways are provided so that the flow of solder into the chamber 23 may be as uniform as possible. The solder is then forced upwardly through the labyrinth path, as described above, and is forced outwardly through the orifice slot 33 into the trough 17 at the upper end thereof. The labyrinth path provides uniform pressure over the entire length of the orifice slot. The solder then flows down the trough in a smooth lamina flow successively over the ridges 21 and the trenches therebetween. The ridges thus form four humps or crests of solder, the solder in the trenches between the ridges 21 being, of course, at lower levels than are the crests of solder at the ridges 21. After the solder passes over the lowermost ridge, it flows back into the body of solder 37 in the tank 11. Since the block 13 is heated through contact with the main body of solder 37, the solder flowing along the trough is maintained at a high temperature.

Since the surface of the solder in the tank 11 plays no part in the operation of the apparatus, it is not necessary to remove the dross which forms on the surface, at frequent intervals. In fact, it may be desirable to leave a certain amount of dross on the surface to prevent further oxidation of the surface.

It is desirable to maintain the flow of solder over the ridges 21 as smooth as possible since turbulence increases the amount of dross which is formed. The illustrated configuration of the ridges 21 has proven effective to maintain a smooth solder flow.

Referring particularly to FIGURE 3, a printed circuit 61 is shown in its path of movement over the trough 17 in a typical soldering operation. The printed circuit includes components 63 which are mounted on the upper surface of the wiring board and which have leads 65 extending through to the lower surface of the board to engage printed conductors which are integral with the lower surface of the board. The leads 65 are shown bent over the lower surface of the board; however, it is not necessary that the leads be bent over since some clearance may be maintained between the lower surface of the board and the tops of the ridges 21. This clearance may be controlled by the configuration of the ridges and by the volume of solder caused to flow in the trough.

The printed circuit 61 should, preferably, be moved in the direction of the arrow so that it engages the lowermost ridge 21 first. It may be desirable to preheat the printed circuits. This provides at least two advantages. Since some dross is likely to form as the solder is flowing over the ridges, the solder at the lower end of the trough will contain more dross than the solder at the upper end. Hence, if the printed circuit is moved in the direction indicated, it will engage the cleanest solder last. Similarly, there will be some loss of temperature in the solder as it flows down the trough. The printed circuit then will engage the coolest solder first and the hottest solder last. This reduces the thermal shock to the wiring board and its components. The last or uppermost ridge 21 provides the cleanest and the hottest solder to practically assure a good soldering of the printed circuit even though portions of the surface may have been missed as it passed over the preceding ridges.

Unlike the normal dip soldering technique, the solder crests lap against the under surface of the printed circuit with the solder flowing or moving relative to the circuit. This effectively removes any trapped flux or gases, thus eliminating bare non-soldered areas or connections. Further, as a result of the lapping action of the solder crests, the printed circuit will be completely soldered even though it may be in a slightly warped condition as it is passed over the soldering apparatus.

Since the printed circuit is inclined at 10 degrees to the horizontal, the surplus solder drains off, by gravity, as the printed circuit passes the last crest. In view of this, and further in view of the angle of the last crest with respect to the printed circuit, the printed circuits may be moved across the soldering apparatus at the high productive rate of between seven and sixten feet per minute. At this rate, the total immersion time is quite short, less than three and one half seconds, enabling the solder to be maintained at a relatively high temperature. Hence, a high quality solder finish is provided without the risk of blistering the circuit board.

What is claimed is:

1. The method of applying molten solder within a tank to the surface of an article with the aid of a trough having a plurality of transverse ridges on the bottom thereof and trenches between said ridges, which method comprises the steps of disposing said trough in an inclined position over said tank in heat receiving relation with said molten solder whereby to heat said trough, passing said molten solder from within said tank to the upper end of said trough and along said trough successively over said ridges and trenches to thereby provide clean, smooth crests of molten solder at said ridges, and passing said article over said trough in a path along only said crests, the surface of said article engaging said crests successively to provide the equivalent of a plurality of fast solder dips thereto.

2. The method of applying molten solder within a tank to the surface of an article with the aid of an inclined trough disposed over said tank to be heated by said molten solder, said trough having a plurality of transverse ridges on the bottom thereof and trenches between said ridges, which method comprises the steps of causing said molten solder to flow from within said tank to the upper end of said inclined trough and successively over said ridges and trenches to thereby form clean, smooth crests of the molten solder at said ridges, and passing said article from the lower end to said upper end of said trough in a path along only said crests, the surface of said article engaging said solder at each of said crests in succession and disengaging said solder at each of said trenches to thereby provide the equivalent of a plurality of fast solder dips thereto.

3. The method of applying solder to the surface of an article with the aid of an inclined trough disposed within a tank containing molten solder and having a plurality of transverse ridges on the bottom thereof and trenches between said ridges, which method comprises the steps of raising the molten solder from a point beneath the surface thereof in said tank to the upper end of said trough, flowing said molten solder uniformly into said trough at its said upper end whereby said molten solder will then flow along said trough successively over said ridges and trenches to provide smooth crests of molten solder at said ridges, and passing said article from the lower end to said upper end of said trough in a path along only said crests, the surface of said article engaging said crests successively to provide the equivalent of a plurality of fast solder dips thereto.

4. Apparatus for applying solder to the surface of an article, said apparatus comprising a tank for molten solder, an inclined trough supported over said tank and having a portion extending into said tank to be heated by said molten solder, a plurality of ridges extending across said trough and spaced from each other to provide trenches therebetween, said trough defining a pathway for said article adjacent to said ridges, and means for raising molten solder from a point beneath the surface of the solder contained in said tank to the upper end of said trough, said trough being inclined at such an angle as to cause the raised, molten solder to flow over said ridges and to form a series of crests at said ridges adapted to be engaged by a surface of said article when said article is moved along said pathway.

5. Apparatus for applying solder to the surface of an article, said apparatus comprising a tank for molten solder, a block having means defining an inclined trough supported in said tank, a plurality of ridges extending across said trough and spaced from each other to provide trenches therebetween, said block being formed with communicating cavities and having an orifice slot extending across the upper end of said trough, means including the walls of said block bounding said cavities and defining a labyrinth path terminating at said orifice slot, and pump means associated with said tank for raising molten solder from a point beneath the solder level in said tank through said labyrinth path and to said orifice slot, said trough being inclined at such an angle as to cause the raised, molten solder to flow along said trough and to form a series of crests at said ridges adapted to be engaged by a surface of said article when said article is moved along a pathway defined by said crests.

6. Apparatus for applying solder to the surface of an article, said apparatus comprising an open tank for molten solder, a block having means defining an inclined trough supported in said tank, a plurality of ridges extending across said trough and spaced from each other to provide trenches therebetween, the tops of said ridges lying in a common plane, said block being formed with communicating cavities, means including the walls of said block bounding said cavities and defining a labyrinth path terminating in an orifice slot extending across the upper end of said trough, and pump means associated with said tank for raising molten solder from a point beneath the solder level in said tank through said labyrinth path and to said orifice slot, said trough being inclined at such an angle as to cause the raised, molten solder to flow along said trough and to form a series of crests at said ridges adapted to be engaged by a surface of said article when said article is moved from the lower end to the upper end of said trough in a pathway defined by said crests.

7. Apparatus for applying solder to the surface of an article, said apparatus comprising an open tank for molten solder, a block of heat conducting material supported in said tank and disposed to extend partially below the solder level in said tank, said block having means defining an inclined trough extending over the upper surface thereof, a plurality of ridges extending across said trough and spaced from each other to provide trenches therebetween, the tops of said ridges lying in a common plane, means defining an orifice slot extending across the upper end of said trough, means defining a labyrinth path at one end of said block terminating in said orifice slot, a pump mounted in said tank for pumping solder from a point beneath the solder level of said tank into said labyrinth path, and pump operating means associated with said pump extending out of said tank adapted to be connected to a driving source, said pump causing solder to flow upwardly through said labyrinth path and along said inclined trough thereby forming a series of crests at said ridges adapted to be engaged by a surface of said article when said article is moved along a pathway defined by said smooth crests.

8. Apparatus for applying solder to the surface of an article, said apparatus comprising an open tank for molten solder, a block of heat conducting metal supported in said tank and disposed to extend beneath the solder level in said tank, means defining an inclined trough on the upper surface of said block, a plurality of ridges disposed transversely in said trough on the bottom surface thereof and spaced from each other to provide trenches therebetween, the tops of said ridges lying in a common plane, means defining an orifice slot at the upper end of said trough to direct solder down said trough, means defining a labyrinth path adjacent to one face of said block, said labyrinth path being connected to said orifice slot, a manifold mounted on said block extending downwardly beneath the solder level in said tank, means defining passageways in said block connecting said manifold to said labyrinth path, a pump associated with said manifold having an intake opening beneath the solder level in said tank, and means associated with said pump extending out of said tank for driving said pump, said last named means being adapted for connection to a drive source, said trough being inclined at such an angle as to cause molten solder to form a series of crests at said ridges when flowing along said trough and over said ridges, said crests being adapted to be successively engaged by the surface of said article moving in a path adjacent to said crests.

References Cited in the file of this patent

UNITED STATES PATENTS

| | | |
|---|---|---|
| 2,469,392 | Jones et al. | May 10, 1949 |
| 2,870,532 | Young | Jan. 27, 1959 |

FOREIGN PATENTS

| | | |
|---|---|---|
| 200,151 | Australia | Nov. 9, 1956 |
| 712,109 | Great Britain | July 21, 1954 |
| 860,154 | France | June 13, 1939 |